(12) United States Patent
Vyas (10) Patent No.: US 8,710,888 B2
(45) Date of Patent: Apr. 29, 2014

(54) SYSTEM AND METHOD FOR OSCILLATOR FREQUENCY CONTROL

(75) Inventor: Bhargav R. Vyas, Bangalore (IN)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/533,691

(22) Filed: Jun. 26, 2012

(65) Prior Publication Data

US 2013/0222022 A1 Aug. 29, 2013

Related U.S. Application Data

(60) Provisional application No. 61/602,732, filed on Feb. 24, 2012.

(51) Int. Cl.
*H03K 5/13* (2006.01)
*H03L 7/081* (2006.01)

(52) U.S. Cl.
CPC .................................. *H03L 7/0812* (2013.01)
USPC .......................................................... 327/243

(58) Field of Classification Search
USPC .......... 327/147–159, 243, 291; 331/176, 185, 331/1 A, 34, 177 R
See application file for complete search history.

(56) References Cited

U.S. PATENT DOCUMENTS

| | | | |
|---|---|---|---|
| 5,798,669 A | 8/1998 | Klughart | |
| 6,292,066 B1 * | 9/2001 | Shibuya et al. | 331/176 |
| 6,353,368 B1 | 3/2002 | Iravani | |
| 2002/0149435 A1 | 10/2002 | Babcock | |
| 2005/0073290 A1 | 4/2005 | Marinca et al. | |
| 2008/0186082 A1 | 8/2008 | Singh et al. | |
| 2009/0039861 A1 | 2/2009 | Wang | |
| 2010/0308902 A1 | 12/2010 | Iriarte et al. | |
| 2011/0234300 A1 | 9/2011 | Zhang et al. | |
| 2012/0068743 A1 | 3/2012 | Youssef et al. | |

FOREIGN PATENT DOCUMENTS

WO 2006025782 A1 3/2006

OTHER PUBLICATIONS

Tokunana, Yusuke, et al., "An On-Chip CMOS Relaxation Oscillator With Voltage Averaging Feedback", IEEE Journal of Solid-State Circuits, Jun. 2010, vol. 45, No. 6, pp. 1150-1158.
Lin, Yijing, U.S. Appl. No. 13/350,035, filed Jan. 13, 2012, "Method and Apparatus for Generating On-Chip Clock With Low Power Consumption", not yet published.
International Search Report and Written Opinion issued for counterpart International Application No. PCT/US2013/026872, report dated Apr. 29, 2013.

* cited by examiner

*Primary Examiner* — Sibin Chen
(74) *Attorney, Agent, or Firm* — Kenyon & Kenyon, LLP (57) ABSTRACT

Techniques to compensate for sources of temperature and process dependent errors within an oscillator system for frequency control oscillator output clock signal. The oscillator system may include a controller and an oscillator circuit. The techniques may include generating a pair of voltages, a first of which is temperature variant, having (approximately) known temperature variations across process, and a second of which is (approximately) temperature invariant. Each voltage may be scaled by a corresponding trim factor. The scaled voltages may be combined to generate a reference voltage. The reference voltage may compensate for process and temperature dependent error sources within the oscillator system to set the oscillator output clock signal frequency.

30 Claims, 6 Drawing Sheets

SYSTEM AND METHOD FOR OSCILLATOR FREQUENCY CONTROL

CROSS-REFERENCE TO RELATED APPLICATION

This application claims the benefit of priority afforded by U.S. Provisional Application Ser. No. 61/602,732, "System And Method For Oscillator Frequency Control", filed Feb. 24, 2012.

BACKGROUND

An oscillator circuit, or simply "oscillator," is an electronic circuit that generates a clock signal at a controlled frequency. A control circuit typically generates a control voltage that sets the output frequency of the oscillator clock signal. Both the oscillator and the control circuit are often manufactured in a single integrated circuit ("IC") chip.

An oscillator control circuit typically uses resistive and capacitive devices to generate the control voltage. These devices have electrical characteristics that vary based on temperature and manufacturing process variations. During manufacture, oscillator control circuits often must be calibrated or "trimmed." Trimming compensates for sources of temperature and process errors within the control circuit so that, during post-manufacture operation, the oscillator generates an approximately constant output clock signal frequency across temperature and process variations.

One current trimming technique involves physically heating an IC chip and trimming the oscillator control circuit at various temperatures such that the oscillator generates the desired clock frequency at each temperature. To trim the chip, a range of trim values for the control circuit are set on a trial-and-error basis until the desired output frequency is achieved at each temperature. This trimming technique, however, requires substantial time to both heat and sweep through all possible trim values for each temperature. Since trimming operations are prolonged, this trimming technique can become costly and time consuming and limit the number of ICs that can be manufactured per unit time.

Another current trimming technique involves manufacturing the resistive and capacitive devices within an oscillator control circuit according to precise manufacturing process specifications. This trimming technique, however, increases the manufacturing costs per unit IC.

Accordingly, there is a need in the art for an oscillator system that minimizes trimming time and compensates for temperature and process dependent error sources within the system.

DETAILED DESCRIPTION

Embodiments of the present invention provide techniques to compensate for sources of temperature and process dependent errors within an oscillator system for frequency control oscillator output clock signal. The oscillator system may include a controller and an oscillator circuit. The techniques may include generating a pair of voltages, a first of which is temperature variant, having (approximately) known temperature variations across process, and a second of which is (approximately) temperature invariant. Each voltage may be scaled by a corresponding trim factor. The scaled voltages may be combined to generate a reference voltage. The reference voltage may compensate for process and temperature dependent error sources within the oscillator system to set the oscillator output clock signal frequency.

The controller and oscillator circuit may be manufactured in a common integrated circuit "IC". Embodiments of the present invention may include a trimming operation, which may be performed during manufacture of the IC to calculate trim factors for each of the temperature variant and invariant voltages. As noted above, during post-manufacture operation of the oscillator system, the voltages may be scaled using the trim factors and combined to generate the reference voltage. The trimming operation as described herein for embodiments of the present invention may enable frequency control of the oscillator circuit to within 1% accuracy of the predetermined frequency during post-manufacture operation of the oscillator system.

The trimming operation may include gathering a set of measurements from the temperature variant and temperature invariant voltages, and an untrimmed output frequency of the oscillator circuit. Following the measurements, the trim factors may be calculated according to a system of equations. The trimming operation may be performed at an ambient temperature for the oscillator system, rather than physically heating the IC, as is necessary for conventional trimming techniques. This may minimize the time required to trim the IC during manufacture. Further, trimming time may be minimized by calculating the trim factors rather than sweeping an entire range of trim values to optimally trim the oscillator control system.

Figure 1:
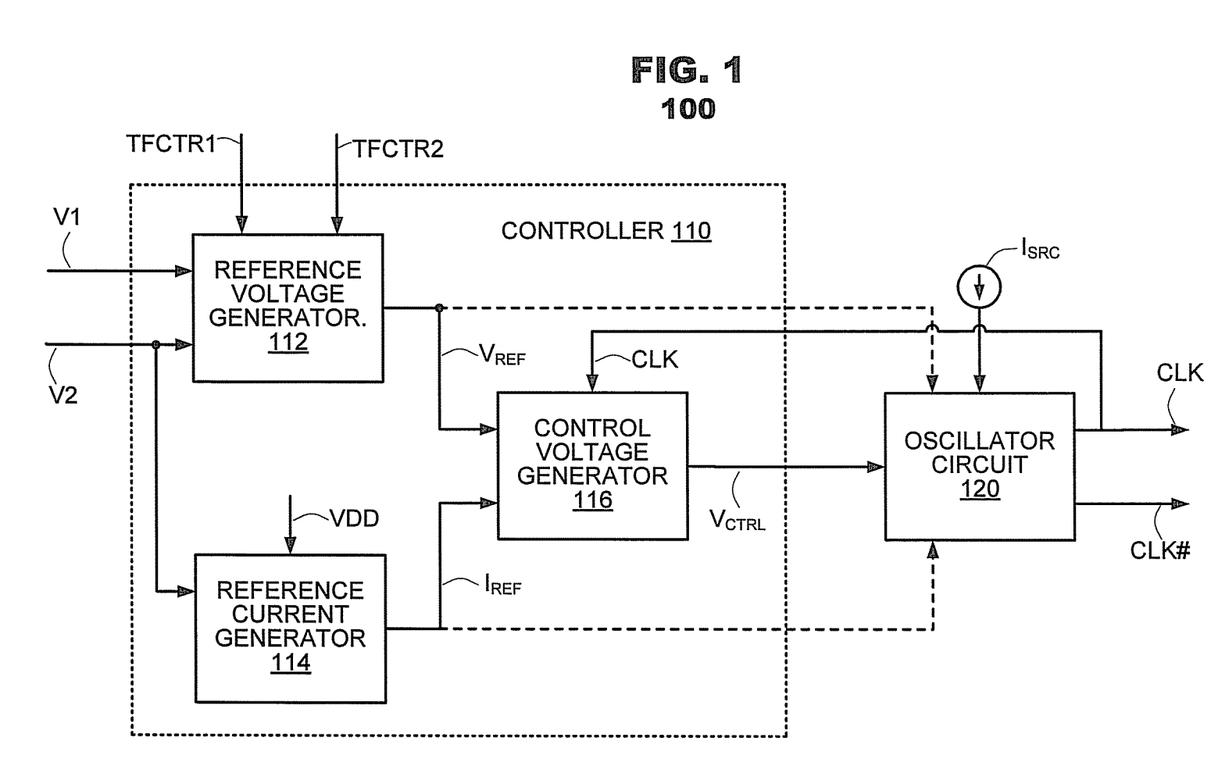
FIG. 1 illustrates an oscillator control system according to an embodiment of the present invention.

FIG. 1 illustrates an oscillator system 100 according to an embodiment of the present invention. As illustrated in FIG. 1, the oscillator system 100 may include a controller 110 and an oscillator circuit 120. The controller 110 may include a reference voltage generator 112, a reference current generator 114, and a control voltage generator 116. The reference voltage generator 112 may receive a pair of input voltages V1, V2, data representing a pair of trim factors TFCTR1, TFCTR2, and may output a reference voltage $V_{REF}$. A first input voltage V1 provided to the reference voltage generator 112 may be a temperature variant voltage having approximately known first-order temperature variations across process. A second input voltage V2 provided to the reference voltage generator 112 may be an approximately temperature invariant voltage. For example, the second input voltage V2, may be a bandgap voltage, which may be calibrated to be approximately temperature invariant.

The reference current generator 114 may receive the temperature invariant voltage V2, a source potential VDD, and may generate a reference current $I_{REF}$ therefrom. The control voltage generator 116 may receive the reference voltage $V_{REF}$, the reference current $I_{REF}$, a clock signal CLK, and may generate a control voltage $V_{CTRL}$ therefrom. The control voltage generator 116 may generate the control voltage $V_L$ by performing frequency-to-voltage conversion of the reference current $I_{REF}$ and the clock signal CLK, which may be output from the oscillator circuit 120. The oscillator circuit 120 may receive the control voltage $V_{CTRL}$ and an input current generated from a current source $I_{SRC}$.

During operation, the reference voltage generator 112 may scale the respective temperature variant and temperature invariant voltages V1, V2 according to corresponding trim factors TFCTR1, TFCTR2. The trim factors may be loaded into the reference voltage generator 112 following a trimming operation, which may be performed during manufacture of the oscillator system 100. The trimming operation will be discussed in further detail herein below. The reference voltage generator 112 may combine the scaled voltages to generate the reference voltage $V_{REF}$.

As discussed, the reference voltage $V_{REF}$ may compensate for operating variations of the controller 110 resulting from process and temperature dependent errors sources. For example, one source of error within the controller 110 may be the reference current generator 114. Another source of error within the controller 110 may be the control voltage generator 116. During operation, the reference voltage $V_{REF}$ may actively adjust operation of the control voltage generator 116 such that the control voltage $V_{CTRL}$ compensates for temperature and process errors within the controller 110.

The generated control voltage $V_{CTRL}$ may provide frequency control of the oscillator circuit 120 output clock signal CLK for a predetermined frequency. By coupling the clock signal CLK to the control voltage generator 116, a feedback loop may be created with the oscillator circuit 120, which may increase frequency stability for the clock signal CLK. The oscillator circuit 120 as described in FIG. 1 may be referred to as a "feedback loop" oscillator. In a differentially-driven system, the oscillator circuit 120 may also generate a complement clock signal CLK# at the predetermined frequency. In an embodiment, the controller 110 and the oscillator circuit 120 may be manufactured in a common IC. Exemplary oscillator circuits and control voltage generators for use with embodiments of the present invention are described in the co-pending patent application, U.S. application Ser. No. 13/350,035, entitled "Method and Apparatus for Generating On-Chip Clock with Low Power Consumption," filed on Jan. 13, 2012, the contents of which are incorporated herein in their entirety.

Figure 2:
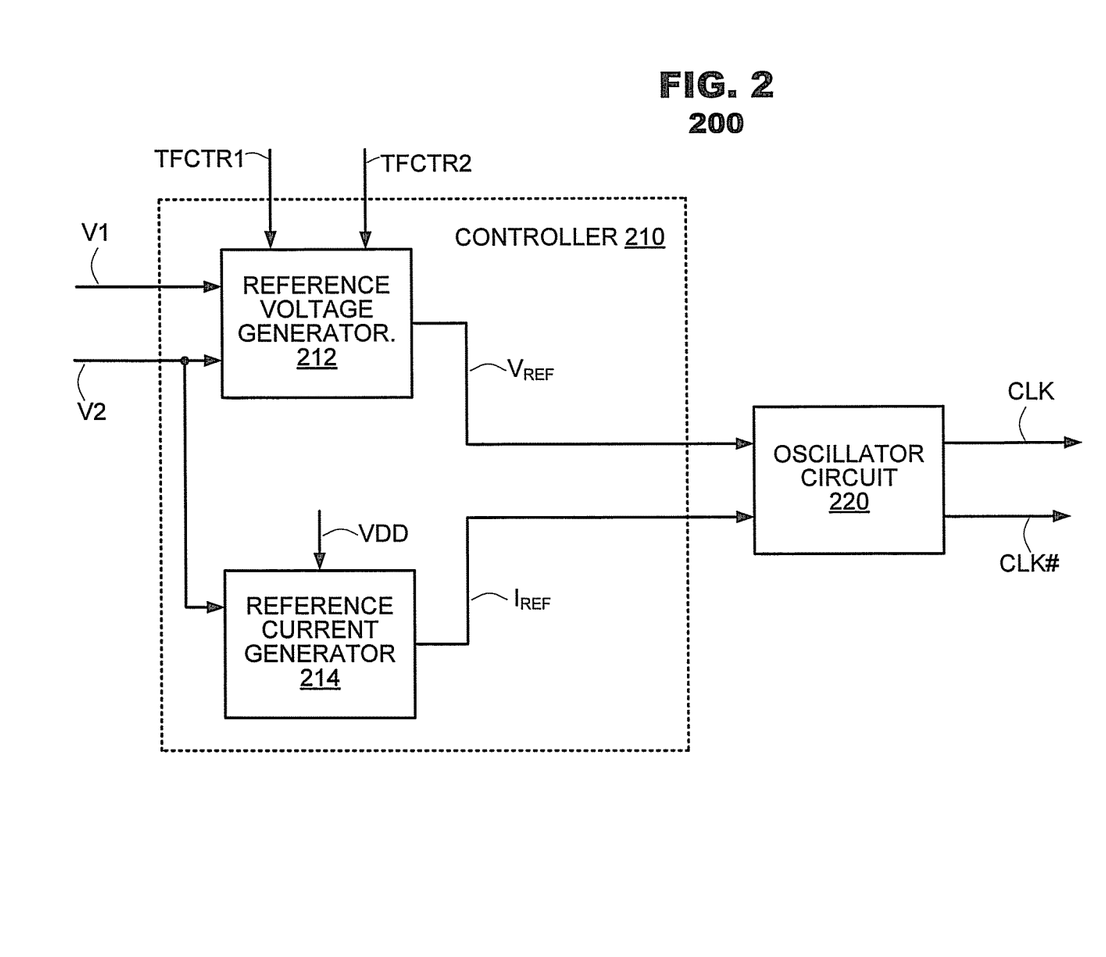
FIG. 2 illustrates another oscillator control system according to an embodiment of the present invention.

In various embodiments, the frequency of the oscillator circuit 120 output clock signal CLK may be below approximately 1 MHz. In such embodiments, the reference voltage generator 112 and the reference current generator 114 may provide frequency control for the oscillator circuit 120. FIG. 2 illustrates an oscillator system 200 according to an embodiment of the present invention for low frequency control of an oscillator circuit 220. The oscillator circuit 220 as described in FIG. 2 may be referred to as an "open loop" oscillator. As illustrated in FIG. 2, a controller 210 may include a reference voltage generator 212, a reference current generator 214.

The reference voltage generator 212 may receive a pair of input voltages V1, V2, data representing a pair of trim factors TFCTR1, TFCTR2, and may output a reference voltage $V_{REF}$. A first input voltage V1 provided to the reference voltage generator 212 may be a temperature variant voltage, having approximately known first-order temperature variations across process. A second input voltage V2 provided to the reference voltage generator 212 may be an approximately temperature invariant voltage. The reference current generator 214 may receive the temperature invariant voltage V2, a source potential VDD, and may generate a reference current $I_{REF}$ therefrom.

During operation, the reference voltage generator 212 may scale the respective temperature variant and temperature invariant voltages V1, V2 according to corresponding trim factors TFCTR1, TFCTR2. The trim factors may be loaded into the reference voltage generator 212 following a trimming operation, which may be performed during manufacture of the oscillator system 200. The reference voltage generator 212 may combine the scaled voltages to generate the reference voltage $V_{REF}$. The reference voltage $V_{REF}$ may actively adjust operation of the oscillator circuit 220 to compensate for temperature and process errors within the controller 210 and the oscillator 220.

Figure 3:
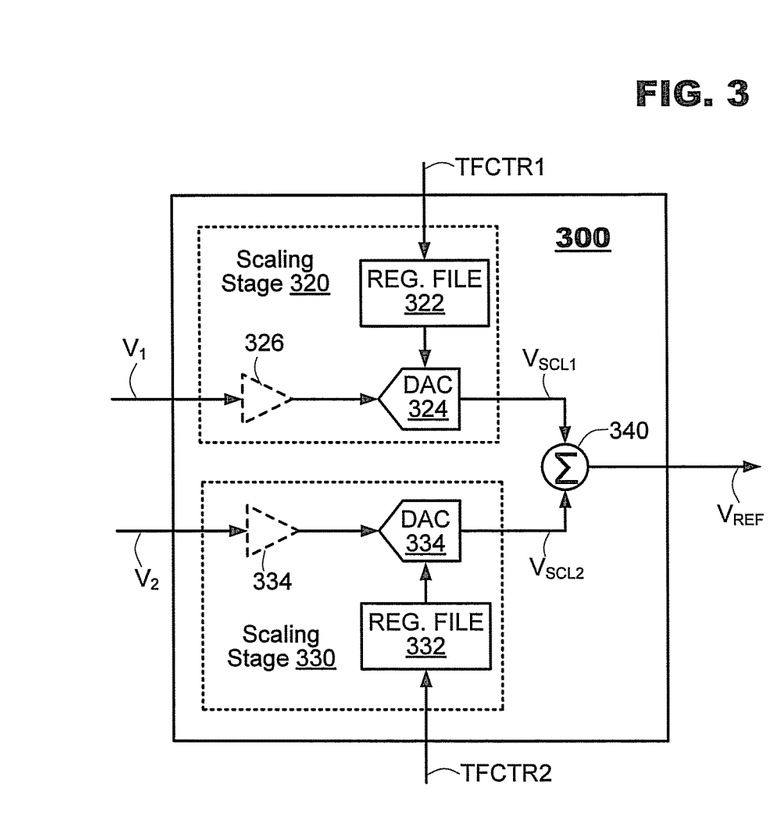
FIG. 3 illustrates a reference voltage generator according to an embodiment of the present invention.

FIG. 3 illustrates a reference voltage generator 300 according to an embodiment of the present invention. As illustrated in FIG. 3, the reference voltage generator 300 may include inputs for receiving the temperature variant and invariant voltages V1, V2, respectively and for a corresponding pair of trim factors TFCTR1, TFCTR2. The reference voltage generator 300 may have an output for a reference voltage $V_{REF}$. The generator 300 may include a pair of scaling stages 320, 330, each for scaling the corresponding temperature variant and invariant voltages V1, V2. For example, scaling stage 320 may include a register file 322 for storing the trim factor TFCTR1. A digital-to-analog converter ("DAC") 324 may receive the trim factor TFCTR1 and the temperature variant voltage V1 and generate a first scaled voltage $V_{SCL1}$. Scaling stage 330 may include a register file 332 and a DAC 334 for performing a similar operation on the temperature invariant voltage V2 using trim factor TFCTR2 to generate a second scaled voltage $V_{SCL2}$. The pair of scaled voltages $V_{SCL1}$, $V_{SCL2}$ from each corresponding scaling stage 320, 330 may be combined using a summer 340 to generate the reference voltage $V_{REF}$.

As noted, the trim factors TFCTR1, TFCTR2 may be calculated during manufacture using a trimming operation. For post-manufacture operation of an oscillator control system, the trim factors TFCTR1, TFCTR2 may be loaded into the respective register files 322, 332 and used to scale the temperature variant and invariant voltages V1, V2.

In an embodiment, each trim factor TFCTR1, TFCTR2 may be a multi-bit word stored in the respective register files 322, 332. In another embodiment, each scaling stage 320, 330 may include a corresponding input buffer 326, 336 for buffering the input voltages V1, V2 input to each DAC 324, 334. The input buffers 326, 336 may be used to buffer spurious signal noise from the temperature variant and invariant voltages V1, V2. The input buffers 326, 336 may also provide additional temperature stability for the reference voltage generator 300 for high temperature operation.

Figure 4:
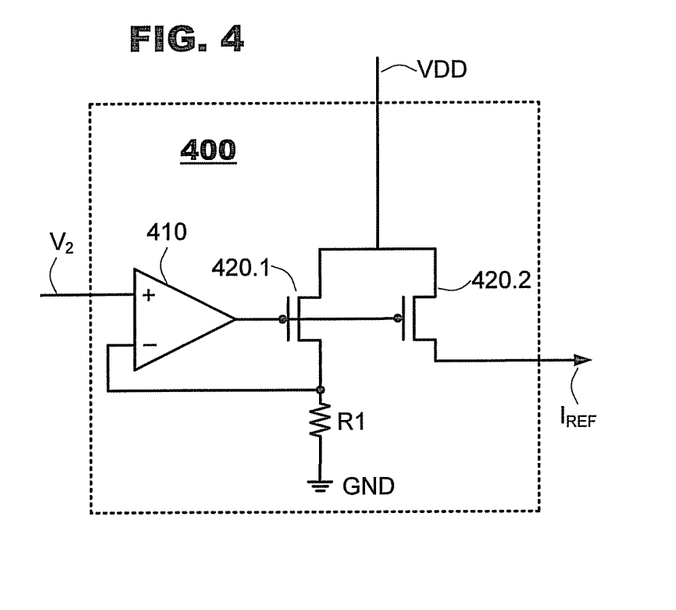
FIG. 4 illustrates a reference current generator according to an embodiment of the present invention.

FIG. 4 illustrates a reference current generator 400 according to an embodiment of the present invention. As illustrated in FIG. 4, the reference current generator 400 may include inputs for the temperature invariant input voltage V2 and for a source potential VDD. The reference current generator 400 may have an output for a reference current $I_{REF}$. The generator 400 may include an operational amplifier ("op-amp") 410, an impedance R1, and a current mirror formed by a pair of scaling transistors 420.1, 420.2.

The op-amp 410 may receive the input voltage V2 at a non-inverting input terminal. Each scaling transistor 420.1, 420.2 may have a first output commonly coupled to the source potential VDD. The op-amp 410 output may be coupled to a control input of the first and second scaling transistors 420.1, 420.2. A second output of scaling transistor 410.1 may be coupled to the inverting input of the op-amp 410. The impedance R1 may be coupled between the op-amp 410 inverting input, the second output of scaling transistor 410.1, and ground GND. The output $I_{REF}$ may be generated from a second output of scaling transistor 420.2.

During operation, op-amp 410 may receive the input voltage V2 and drive an output signal across the scaling transistors 420.1, 420.2, and the impedance R1 to develop the output current $I_{REF}$. The output current $I_{REF}$ magnitude may be proportional to V2/R1.

The response of impedance R1 may vary during operation corresponding to temperature fluctuations, which may, in turn, cause the reference current $I_{REF}$ to fluctuate. The temperature fluctuations may be compensated for by the reference voltage $V_{REF}$, as generated by the reference voltage generator 300.

Trimming an Oscillator System

During manufacture of an oscillator system, a trimming operation may be performed to calibrate the oscillator controller. Specifically, the trimming operation may calibrate the reference voltage generator within the controller such that the reference voltage generator may generate a reference voltage during normal (post-manufacture) operation, which may compensate for process and temperature dependent error sources within the oscillator system. For example, for a feedback loop oscillator circuit, the reference voltage may provide adjustments to the generated control voltage, which may, in turn, control the frequency of the oscillator circuit output clock signal to a predetermined frequency. During manufacture, the predetermined frequency may be set by adjusting the internal impedance of the reference current generator and an internal capacitance of the control voltage generator within the controller. In effect, the RC time constant of the impedance and capacitance may set the output frequency of the oscillator.

For a trimming operation, the temperature variant and invariant voltages V1, V2 input to the reference voltage generator may be measured. The period of an oscillator circuit output clock signal may also be measured (i.e., the untrimmed period of the oscillator circuit). From the measurements, trim factors (e.g., TFCTR1, TFCTR2 of FIG. 1) for the reference voltage generator may be calculated. The first trim factor, TFCTR1 may be used to trim the temperature variant voltage V1. The second trim factor, TFCTR2 may be used to trim the temperature invariant voltage V2. Trimming the temperature variant and invariant voltages V1, V2 may compensate for both process and temperature dependent error sources. Hence, compensation for process and temperature dependent error sources may be coupled using trimming techniques according to embodiments of the present invention.

For a given oscillator controller (e.g., controller 110 of FIG. 1, controller 210 of FIG. 2) a system of equations may be derived which may characterize the oscillator frequency control provided by the controller. For example, frequency control for the feedback loop oscillator 120 provided by controller 110 of FIG. 1 may be described as a linear combination of trim factors TFCTR1 and TFCTR2 applied to voltages V1 and V2 as illustrated by the following equation:

$$P=RC*(TFCTR2-TFCTR1*V1/V2) \quad \text{Eqn. 1}$$

For Eqn. 1, P may be set to a predetermined clock frequency for the oscillator circuit 120 output clock signal CLK. The term RC, may be a measured (untrimmed) clock frequency for the oscillator circuit 120 output clock CLK as measured during a trimming operation. Equation 1 may be differentiated and set equal to zero as follows:

$$0=TFCTR2*TCO_{RC}-TFCTR1*V1/V2*(TCO_{V1}+TCO_{RC}) \quad \text{Eqn. 2}$$

For Eqn. 2, $TCO_{RC}$ may be an approximately constant temperature coefficient determined by adding a temperature coefficient for the internal impedance of the reference current generator 114 to a temperature coefficient for an internal capacitance of the control voltage generator 116. The term $TCO_{V1}$ may be an approximately constant temperature coefficient across process for the temperature variant voltage V1. For a trimming operation, Eqns. 1 and 2 may be solved to determine the trim factors TFCTR1 and TFCTR2.

In an embodiment, the calculated trim factors TFCTR1, TFCTR2 may be quantized to a predetermined bit width and stored within the reference voltage generator (e.g., stored in the register files 322, 332 of FIG. 3) for post-manufacture operation of the oscillator system. In various embodiments, the measured (untrimmed) clock frequency RC for Eqn. 1 may be scaled by a predetermined scaling factor to adjust for the clock division, which may be performed within the voltage control generator.

In another example, frequency control for the open loop oscillator 220 provided by controller 210 of FIG. 2 may be described as a linear combination of trim factors TFCTR1 and TFCTR2 applied to voltages V1 and V2 as illustrated by the following equation:

$$P=2*RC*(TFCTR2-TFCTR1*V3/V2)+\Delta \quad \text{Eqn. 3}$$

For Eqn. 3, P may be set to a predetermined clock frequency for the oscillator circuit 220 output clock signal CLK. The term RC, may be a measured (untrimmed) clock frequency for the oscillator circuit output clock CLK as measured during a trimming operation. The term $\Delta$ may be equal to the propagation delay through the comparator(s) within an oscillator circuit. For low frequency operation (less than approximately 1 MHz), the $\Delta$ term may assumed to be zero. Equation 3 (assuming $\Delta$ may be zero) may be differentiated and set equal to zero as follows:

$$0=TFCTR2*TCO_{RC}-TFCTR1*V1/V2*(TCO_{V1}+TCO_{RC}) \quad \text{Eqn. 4}$$

For Eqn. 4, $TCO_{RC}$ may be an approximately constant temperature coefficient determined by adding a temperature coefficient for the internal impedance of the reference current generator 214 to a temperature coefficient for the internal capacitance the oscillator circuit 220. The term $TCO_{V1}$ may be an approximately constant temperature coefficient across process for the temperature variant voltage V1. For a trimming operation, Eqns. 3 and 4 may be solved to determine the trim factors TFCTR1 and TFCTR2.

Equations 1-4 illustrate that the trimming techniques as described for embodiments of the present invention may be performed for any given oscillator control system, which may be described, mathematically, as any linear combination of trim factors TFCTR1 and TFCTR2 and temperature variant and invariant voltages V1 and V2. The first order temperature variations of V1 may be approximately known. For a feedback loop oscillator circuit, scaling the temperature variant and invariant voltages V1 and V2 may provide compensation for process and temperature dependent error sources within an oscillator control system. For an open loop oscillator circuit, scaling the temperature variant and invariant voltages V1 and V2 may provide compensation for process and temperature dependent error sources within an oscillator control system and the oscillator circuit itself.

Figure 5:
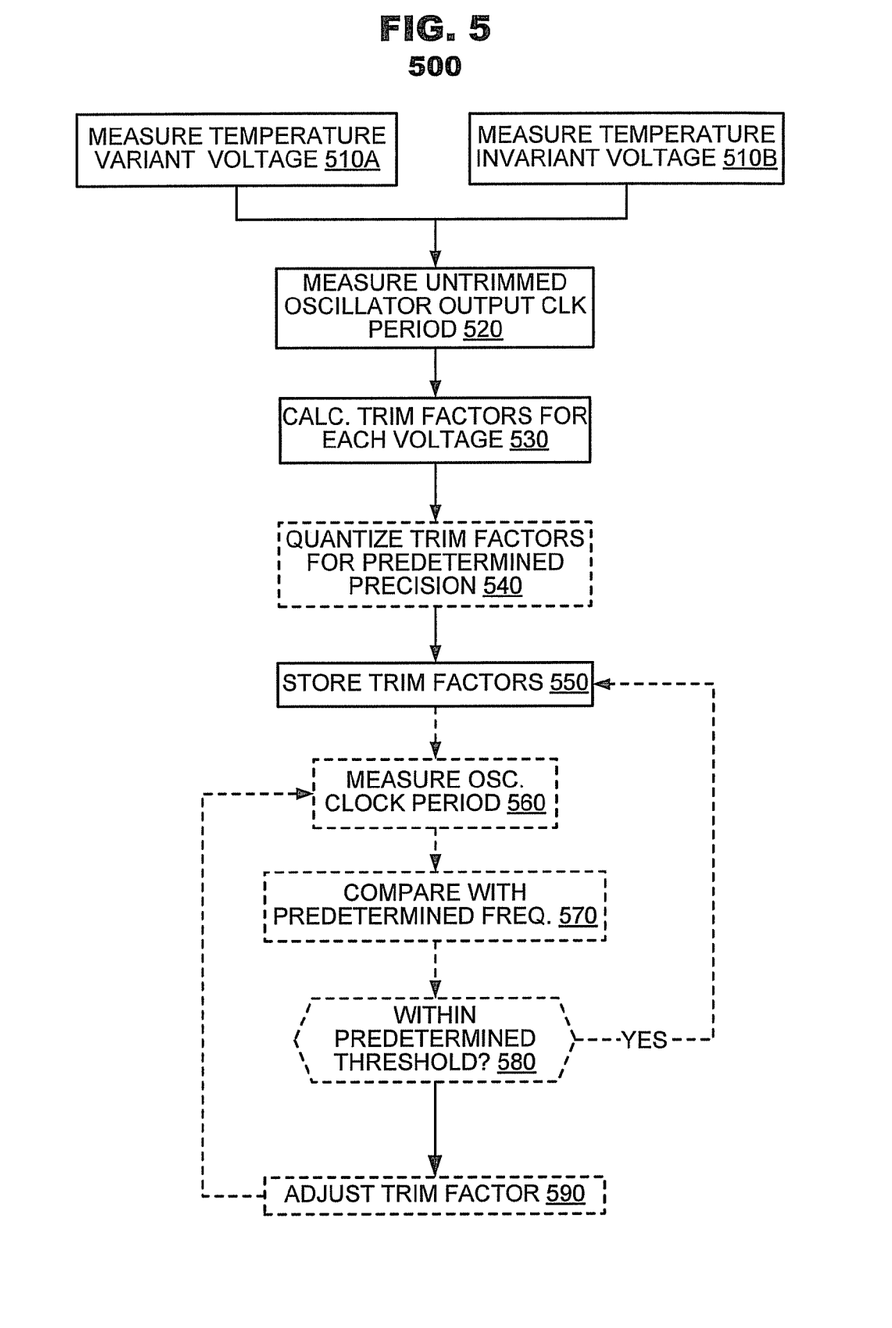
FIG. 5 illustrates a method for trimming an oscillator control system for frequency control of an oscillator according to an embodiment of the present invention.

FIG. 5 illustrates a method 500 for trimming an oscillator control system for frequency control of an oscillator according to an embodiment of the present invention. The method 500 may measure a temperature variant voltage (block 510A) and an approximately temperature invariant voltage (block 510B). The method 500 may measure the oscillator output signal period (block 520). Using the measurements, the method 500 may calculate trim factors for each of the voltages (block 530). The method 500 may store the trim factors for use in subsequent operation of the oscillator (block 550).

In an embodiment, the method 500 may re-measure the oscillator output signal clock period (block 560). The method 500 may compare the oscillator output signal period to a predetermined frequency for the oscillator output signal to determine a difference between the two (block 570). The difference may be compared against a predetermined error threshold (block 580). If the output clock period is greater than the threshold, the method 500 may adjust a trim factor until the period of the oscillator output signal period falls below the predetermined error threshold (block 590). The method may store the trim factor (return to block 550).

In an embodiment, the method may calculate the trim factors for each voltage according to Eqns. 1 and 2. In another embodiment, the method may quantize the calculated trim factors according to a predetermined bit width (block 540). In such an embodiment, the method may store the quantized trim factors for frequency control of the oscillator circuit output signal.

Figure 6:
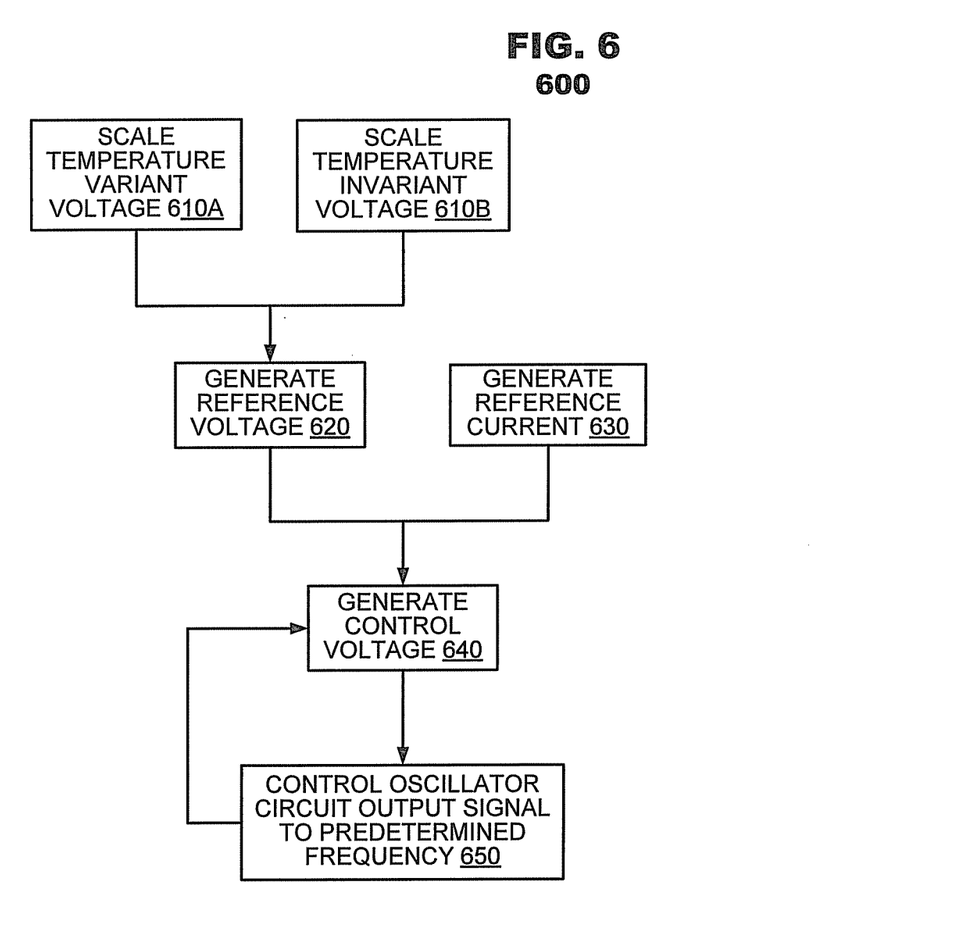
FIG. 6 illustrates a method for controlling an oscillator to generate an output signal at a predetermined output frequency according to an embodiment of the present invention.

FIG. 6 illustrates a method 600 for controlling an oscillator to generate an output signal at a predetermined output frequency according to an embodiment of the present invention. As illustrated in FIG. 6, the method 600 may scale a first temperature variant voltage with a first trim factor (block 610A) and may scale a second approximately temperature invariant voltage with a second trim factor (block 610B). The method 600 may generate a reference voltage from the scaled first and second voltages (block 620). The method 600 may generate a reference current using the second approximately temperature invariant voltage (block 630). The method 600 may generate a control voltage from the reference voltage, the reference current, and the oscillator circuit output signal (block 640). The method 600 may control the oscillator circuit with the control voltage to generate the output signal at the predetermined frequency (block 650).

In an embodiment, the method 600 may control the oscillator circuit to generate a complement output signal at the predetermined frequency.

Several embodiments of the present invention are specifically illustrated and described herein. However, it will be appreciated that modifications and variations of the present invention are covered by the above teachings. In other instances, well-known operations, components and circuits have not been described in detail so as not to obscure the embodiments. It can be appreciated that the specific structural and functional details disclosed herein may be representative and do not necessarily limit the scope of the embodiments.

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

I claim:

1. An oscillator control system, comprising:
a reference voltage generator to receive a first temperature variant voltage and to scale the first temperature variant voltage according to a first scaling factor, to receive a second approximately temperature invariant voltage and to scale the second approximately temperature invariant voltage according to a second scaling factor, and to generate a reference voltage, wherein the reference voltage represents a summation of the scaled first and second voltages;
a reference current generator to receive the second approximately temperature invariant voltage and to generate a reference current; and
a control voltage generator to receive the reference voltage, the reference current, and a dock signal and to generate a control voltage, wherein the dock signal is output from an oscillator circuit, and wherein the reference voltage adjusts the control voltage to compensate for process and temperature dependent error sources within the reference current generator and the control voltage generator to control the oscillator output signal to a predetermined frequency.

2. The oscillator control system of claim 1, wherein the first scaling factor compensates for process dependent error sources within the oscillator control system.

3. The oscillator control system of claim 1, wherein the second scaling factor compensates for temperature dependent error sources within the oscillator control system.

4. The oscillator control system of claim 1, wherein at least one of the first scaling factor and the second scaling factor is a multi-bit word.

5. The oscillator control system of claim 1, wherein the reference voltage generator includes:
a first scaling stage receiving the first temperature variant voltage and scaling the first voltage;
a second scaling stage receiving the second approximately temperature invariant voltage and scaling the second voltage;
a summation circuit to combine the scaled first and second voltages.

6. An oscillator control system, comprising:
a reference voltage generator to receive a first temperature variant voltage and to scale the first temperature variant voltage according to a first scaling factor, to receive a second approximately temperature invariant voltage and to scale the second approximately temperature invariant voltage according to a second scaling factor, and to generate a reference voltage, wherein the reference voltage represents a summation of the scaled first and second voltages;
a reference current generator to receive the second approximately temperature invariant voltage and to generate a reference current; and
an oscillator circuit to receive the reference voltage and the reference current, wherein the reference voltage adjusts for process and temperature dependent error sources within the reference current generator and the oscillator circuit to control an output signal generated from the oscillator circuit to a predetermined frequency.

7. The oscillator control system of claim 6, wherein the first scaling factor compensates for process dependent error sources within the oscillator control system.

8. The oscillator control system of claim 6, wherein the second scaling factor compensates for temperature dependent error sources within the oscillator control system.

9. The oscillator control system of claim 6, wherein at least one of the first scaling factor and the second scaling factor is a multi-bit word.

10. The oscillator control system of claim 6, wherein the reference voltage generator includes:
a first scaling stage receiving the first temperature variant voltage and scaling the first voltage;

a second scaling stage receiving the second approximately temperature invariant voltage and scaling the second voltage;

a summation circuit to combine the scaled first and second voltages.

11. A method for trimming an oscillator circuit output signal, comprising:

measuring a first temperature variant voltage;

measuring a second approximately temperature invariant voltage;

measuring an untrimmed period of an oscillator circuit output signal, wherein the untrimmed period of the oscillator circuit output signal is generated at least in part from the first and second measured voltages;

calculating a respective trim factor for each of the corresponding first and second voltages based on the measured period;

storing the first and second voltage trim factors for use in subsequent operation of the oscillator circuit; and generating a reference current using the second approximately temperature invariant voltage.

12. The method of claim 11, wherein the first and second trim factors are quantized to a predetermined precision.

13. The method of claim 11, wherein the first and second trim factors are calculated according to $P=2*RC*(TFCTR2-TFCTR1*V1/V2)+\Delta$ and $0=TFCTR2*TCO_{RC}-TFCTR1*V1/V2*(TCO_{V1}+TCO_{RC})$, and wherein P is predetermined dock frequency for the oscillator circuit, RC is the untrimmed frequency of the oscillator circuit, V1 is the first temperature variant voltage, V2 is the second approximately temperature invariant voltage, TFCTR1 is the trim factor for the first temperature variant voltage, TFCTR2 is the trim factor for the second approximately temperature invariant voltage, $\Delta$ is the propagation delay through comparators of the oscillator circuit, $TCO_{RC}$ is an approximately constant temperature coefficient, and $TCO_{V1}$ is the is an approximately constant temperature coefficient across process for temperature variant voltage V1.

14. The method of claim 11, further comprising:

measuring a trimmed period of the oscillator circuit output signal;

comparing the measured period with a predetermined period;

if the measured period is not within a predetermined error threshold of the predetermined period,
adjusting the first and second trim factors for each of the first and second voltages, and repeating the measuring and comparing until the measured period is within the predetermined error threshold; and if the measured period is within the predetermined error threshold,
storing the first and second trim factors for subsequent operation of the oscillator circuit.

15. The method of claim 11, wherein the untrimmed period of the oscillator circuit is generated using the reference current.

16. The method of claim 11, wherein the untrimmed period of the oscillator circuit is generated based on a control voltage, and the control voltage is generated based on the first temperature variant voltage and the second approximately temperature invariant voltage.

17. A method for controlling an oscillator circuit to generate an output signal at a predetermined output frequency, comprising:

scaling a first temperature variant voltage with a first trim factor;

scaling a second approximately temperature invariant voltage with a second trim factor;

generating a reference voltage from the first and second scaled voltages;

generating a reference current from the second approximately temperature invariant voltage;

generating an oscillator control voltage using the reference voltage, the reference current, and the oscillator output signal; and controlling the oscillator circuit with the oscillator control voltage to generate the output signal at the predetermined output frequency.

18. The method of claim 17, wherein the first and second trim factors are calculated according to $P=RC*(TFCTR2-TFCTR1*V1/V2)$ and $0=TFCTR2*TCO_{RC}-TFCTR1*V1/V2*(TCO_{V1}+TCO_{RC})$, and wherein P is predetermined clock frequency for the oscillator circuit, RC is the untrimmed frequency of the oscillator circuit, V1 is the first temperature variant voltage, V2 is the second approximately temperature invariant voltage, TFCTR1 is the first trim factor, TFCTR2 is the second trim factor, $TCO_{RC}$ is an approximately constant temperature coefficient, and $TCO_{V1}$ is the is an approximately constant temperature coefficient across process for temperature variant voltage V1.

19. The method of claim 17, wherein the first and second trim factors are calculated according to $P=2*RC*(TFCTR2-TFCTR1*V1/V2)+\Delta$ and $0=TFCTR2*TCO_{RC}-TFCTR1*V1/V2*(TCO_{V1}+TCO_{RC})$, and wherein P is predetermined dock frequency for the oscillator circuit, RC is the untrimmed frequency of the oscillator circuit, V1 is the first temperature variant voltage, V2 is the second approximately temperature invariant voltage, TFCTR1 is the first trim factor, TFCTR2 is the second trim factor, $\Delta$ is the propagation delay through comparators of the oscillator circuit, $TCO_{RC}$ is an approximately constant temperature coefficient, and $TCO_{V1}$ is the is an approximately constant temperature coefficient across process for temperature variant voltage V1.

20. A method for controlling an oscillator circuit to generate an output signal at a predetermined output frequency, comprising:

scaling a first temperature variant voltage with a first trim factor;

scaling a second approximately temperature invariant voltage with a second trim factor;

generating a reference voltage from the first and second scaled voltages;

generating a reference current from the second approximately temperature invariant voltage; and controlling the oscillator circuit with the reference voltage and the reference current to generate the output signal at the predetermined output frequency.

21. The method of claim 20, wherein the first and second trim factors are calculated according to $P=2*RC*(TFCTR2-TFCTR1*V1/V2)$ and $0=TFCTR2*TCO_{RC}-TFCTR1*V1/V2*(TCO_{V1}+TCO_{RC})$, and wherein P is predetermined clock frequency for the oscillator circuit, RC is the untrimmed frequency of the oscillator circuit, V1 is the first temperature variant voltage, V2 is the second approximately temperature invariant voltage, TFCTR1 is the first trim factor, TFCTR2 is the second trim factor, $TCO_{RC}$ is an approximately constant temperature coefficient, and $TCO_{V1}$ is the is an approximately constant temperature coefficient across process for temperature variant voltage V1.

22. The method of claim 20, wherein the first and second trim factors are calculated according to $P=2*RC*(TFCTR2-TFCTR1*V1/V2)+\Delta$ and $0=TFCTR2*TCO_{RC}-TFCTR1*V1/V2*(TCO_{V1}+TCO_{RC})$, and wherein P is predetermined dock frequency for the oscillator circuit, RC is the untrimmed frequency of the oscillator circuit, V1 is the first temperature variant voltage, V2 is the second approximately temperature invariant voltage, TFCTR1 is the first trim factor, TFCTR2 is the second trim factor, Δ is the propagation delay through comparators of the oscillator circuit, $TCO_{RC}$ is an approximately constant temperature coefficient, and $TCO_{V1}$ is the is an approximately constant temperature coefficient across process for temperature variant voltage V1.

23. A method for trimming an oscillator circuit output signal, comprising:
generating an untrimmed control voltage for an oscillator circuit from a first temperature variant voltage and a second approximately temperature invariant voltage;
measuring an untrimmed period of the oscillator circuit output signal;
calculating a trim factor for the control voltage including a first voltage trim factor for the first temperature variant voltage and a second voltage trim factor for the second approximately temperature invariant voltage based on the untrimmed period of the oscillator circuit output signal; and
storing the first and second voltage trim factors for use in subsequent operation of the oscillator circuit,
wherein the untrimmed control voltage is generated from a reference current, the reference current being generated based at least in part on the second approximately temperature invariant voltage.

24. The method of claim 23, wherein the oscillator circuit output signal is generated based at least in part on the control voltage and the reference current.

25. The method of claim 23, wherein the first and second trim factors are quantized to a predetermined precision.

26. The method of claim 23, wherein the first and second trim factors are calculated according to P=2*RC*(TFCTR2−TFCTR1*V1/V2)+Δ and 0=TFCTR2*$TCO_{RC}$−TFCTR1*V1/V2*($TCO_{V1}$+$TCO_{RC}$), and wherein P is predetermined dock frequency for the oscillator circuit, RC is the untrimmed frequency of the oscillator circuit, V1 is the first temperature variant voltage, V2 is the second approximately temperature invariant voltage, TFCTR1 is the trim factor for the first temperature variant voltage, TFCTR2 is the trim factor for the second approximately temperature invariant voltage, Δ is the propagation delay through comparators of the oscillator circuit, $TCO_{RC}$ is an approximately constant temperature coefficient, and $TCO_{V1}$ is the is an approximately constant temperature coefficient across process for temperature variant voltage V1.

27. A method for trimming an Oscillator circuit output signal, comprising:
generating an untrimmed control voltage for an oscillator circuit from a first temperature variant voltage and a second approximately temperature invariant voltage;
measuring an untrimmed period of the oscillator circuit output signal;
calculating a trim factor for the control voltage including a first voltage trim factor for the first temperature variant voltage and a second voltage trim factor for the second approximately temperature invariant voltage based on the untrimmed period of the oscillator circuit output signal; and
storing the first and second voltage trim factors for use in subsequent operation of the oscillator circuit,
wherein the first and second trim factors are calculated according to P=RC*(TFCTR2−TFCTR1*V1/V2) and 0=TFCTR2*$TCO_{RC}$−TFCTR1*V1/V2*($TCO_{V1}$+$TCO_{RC}$), and wherein P is predetermined dock frequency for the oscillator circuit, RC is the untrimmed frequency of the oscillator circuit, V1 is the first temperature variant voltage, V2 is the second approximately temperature invariant voltage, TFCTR1 is the trim factor for the first temperature variant voltage, TFCTR2 is the trim factor for the second approximately temperature invariant voltage, $TCO_{RC}$ is an approximately constant temperature coefficient, and $TCO_{V1}$ is the is an approximately constant temperature coefficient across process for temperature variant voltage V1.

28. The method of claim 27, wherein the first and second trim factors are quantized to a predetermined precision.

29. A method for trimming an oscillator circuit output signal, comprising:
measuring a first temperature variant voltage;
measuring a second approximately temperature invariant voltage;
measuring an untrimmed period of an oscillator circuit output signal, wherein the untrimmed period of the oscillator circuit output signal is generated at least in part from the first and second measured voltages;
calculating a respective trim factor for each of the corresponding first and second voltages based on the measured period;
storing the first and second voltage trim factors for use in subsequent operation of the oscillator circuit; and
wherein the first and second trim factors are calculated according to P=RC*(TFCTR2−TFCTR1*V1/V2) and 0=TFCTR2*$TCO_{RC}$−TFCTR1*V1/V2*($TCO_{V1}$+$TCO_{RC}$), and wherein P is predetermined dock frequency for the oscillator circuit, RC is the untrimmed frequency of the oscillator circuit, V1 is the first temperature variant voltage, V2 is the second approximately temperature invariant voltage, TFCTR1 is the trim factor for the first temperature variant voltage, TFCTR2 is the trim factor for the second approximately temperature invariant voltage, $TCO_{RC}$ is an approximately constant temperature coefficient, and $TCO_{V1}$ is the is an approximately constant temperature coefficient across process for temperature variant voltage V1.

30. The method of claim 29, further comprising:
measuring a trimmed period of the oscillator circuit output signal;
comparing the measured period with a predetermined period;
if the measured period is not within a predetermined error threshold of the predetermined period,
adjusting the first and second trim factors for each of the first and second voltages, and repeating the measuring and comparing until the measured period is within the predetermined error threshold; and
if the measured period is within the predetermined error threshold,
storing the first and second trim factors for subsequent operation of the oscillator circuit.

* * * * *

UNITED STATES PATENT AND TRADEMARK OFFICE
CERTIFICATE OF CORRECTION

PATENT NO. : 8,710,888 B2
APPLICATION NO. : 13/533691
DATED : April 29, 2014
INVENTOR(S) : Bhargav R. Vyas It is certified that error appears in the above-identified patent and that said Letters Patent is hereby corrected as shown below:

In the Claims

Column 9, line 29, please change:

"dock" to --clock--;

Column 9, line 37, please change:

"is the is an approximately" to --is an approximately--;

Column 10, line 29, please change:

"dock" to --clock--;

Column 10, line 36, please change:

"is the is an approximately" to --is an approximately--;

Column 10, line 61, please change:

"is the is an approximately" to --is an approximately--;

Column 11, line 1, please change:

"dock" to --clock--;

Column 11, line 8, please change:

"is the is an approximately" to --is an approximately--;

Column 11, line 39, please change:

"dock" to --clock--;

Signed and Sealed this
Twenty-first Day of October, 2014

Michelle K. Lee
*Deputy Director of the United States Patent and Trademark Office*

CERTIFICATE OF CORRECTION (continued)
U.S. Pat. No. 8,710,888 B2

Column 11, line 47, please change:

"is the is an approximately" to --is an approximately--;

Column 11, line 50, please change:

"an Oscillator" to --an oscillator--;

Column 12, line 6, please change:

"dock" to --clock--;

Column 12, line 14, please change:

"is the is an approximately" to --is an approximately--;

Column 12, line 36, please change:

"dock" to --clock--;

Column 12, line 43, please change:

"is the is an approximately" to --is an approximately--.